United States Patent
Morelli et al.

(10) Patent No.: US 9,413,408 B2
(45) Date of Patent: Aug. 9, 2016

(54) METHOD FOR PERSONALIZING SIM CARDS WITH A PRODUCTION MACHINE

(71) Applicant: STMICROELECTRONICS S.R.L., Agrate Brianza (IT)

(72) Inventors: Paolo Morelli, Succivo (IT); Giancarlo Pasquariello, Naples (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 614 days.

(21) Appl. No.: 13/748,725

(22) Filed: Jan. 24, 2013

(65) Prior Publication Data

US 2013/0196645 A1    Aug. 1, 2013

(30) Foreign Application Priority Data

Jan. 31, 2012   (IT) .............................. MI2012A0124

(51) Int. Cl.
*H04B 1/3816*  (2015.01)
*G06K 19/077*  (2006.01)
*G06K 17/00*   (2006.01)

(52) U.S. Cl.
CPC ........ *H04B 1/3816* (2013.01); *G06K 19/07716* (2013.01); *G06K 2017/0041* (2013.01)

(58) Field of Classification Search
None
See application file for complete search history.

(56) References Cited

U.S. PATENT DOCUMENTS

| | | | |
|---|---|---|---|
| 4,851,651 A | 7/1989 | Gaucher | |
| 6,152,755 A * | 11/2000 | Lee | H01L 21/67346 324/750.25 |
| 6,532,395 B1 * | 3/2003 | Bolotin | H05K 13/0417 29/832 |
| 6,695,205 B1 * | 2/2004 | Lundstrom | G06K 17/00 235/380 |
| 2002/0186302 A1 * | 12/2002 | Pulkinnen | G05B 19/408 348/207.99 |
| 2004/0015612 A1 * | 1/2004 | Gossel | G06K 17/00 710/1 |

* cited by examiner

*Primary Examiner* — Mohammad Ali
*Assistant Examiner* — Saad M Kabir
(74) *Attorney, Agent, or Firm* — Allen, Dyer, Doppelt, Milbrath & Gilchrist, P.A.

(57) ABSTRACT

A method for personalizing a SIM card may include loading the SIM card on a conveyor belt of a production machine, programming the SIM card, and unloading the programmed SIM card from the conveyor belt. If the intermediate result is wrong, the method may check an intermediate result of the programming and re-program the SIM card.

23 Claims, 12 Drawing Sheets

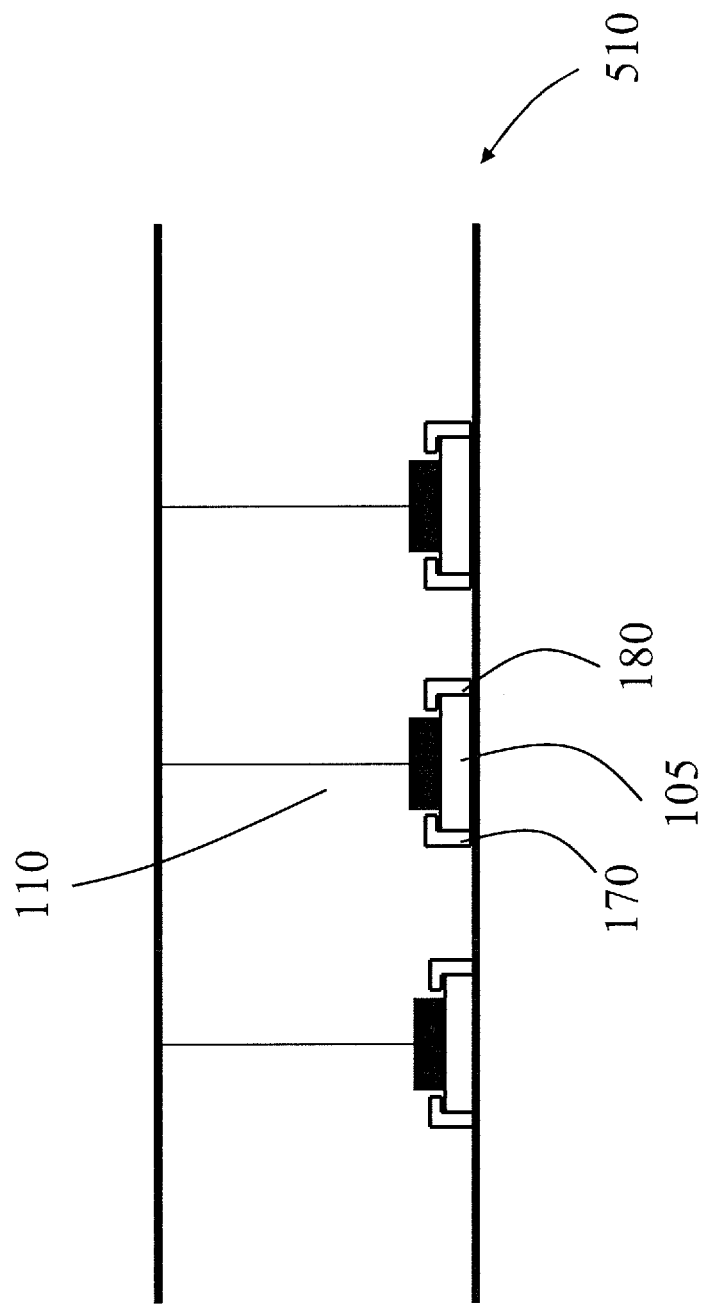

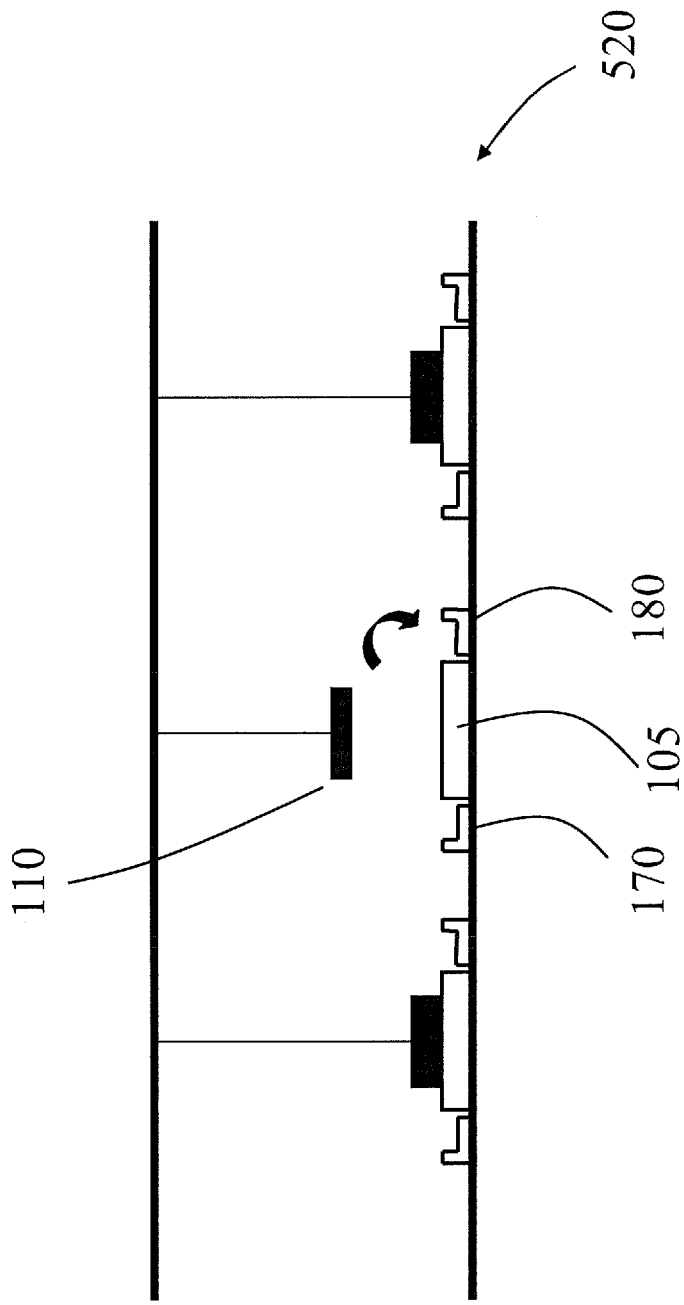

METHOD FOR PERSONALIZING SIM CARDS WITH A PRODUCTION MACHINE

FIELD OF THE DISCLOSURE

The present invention relates to a method for personalizing subscriber identity module (SIM) cards with a production machine.

BACKGROUND

As is typical, after the SIM cards are manufactured, i.e. after the processor, memory and wire lines connections assembly, they are personalized (programmed) with a production machine. The production machine comprises a conveyer belt where SIM cards are placed for receiving personalization data from a head of the production machine, which is moved to contact the cards and to transfer data, for example, loading an operating system (OS), a common file system, and/or specific data.

FIG. 1 shows a production machine (i.e. a personalization machine 220) for personalizing SIM cards and comprising a conveyor belt 115, a plurality of heads 110 for programming a corresponding plurality of SIM cards loaded on the conveyor belt, and a support for the heads 120. The production machine 100 is controlled by a programmable logic controller (PLC) 210 as shown in FIG. 2, which is connected to a personal computer (PC). More particularly, the PLC 210 loads the SIM card 105 on an entry of the conveyor belt 115 and moves the heads on the SIM cards. An application program installed in the PC 200 may provide a user interface to control the whole personalization process. More particularly, the PC 200 is a slave and the PLC 210 is a master of a communication between PLC and PC. The PLC sends a message to the PC specifying a position of the SIM cards on the conveyor belt. When the application program on the PC receives a message confirming a correct position of the cards on the conveyor belt, it starts the programming. When the programming is terminated the application program on the PC retrieves results from the heads 110 and transmits the results to the PLC 210, which unloads cards form the conveyor belt. In the case where programming for the SIM cards failed, they (a result of failure is returned) are discarded.

For example, with reference to FIG. 1, eight SIM cards are contemporaneously loaded on the conveyer belt 115 of the production machine, for personalization, and eight heads 110 of the production machine are moved to contact the SIM cards. The PLC controlling the production machine transmits a message to the PC, to notify that the heads 115 are ready to start personalization. When the programming of the SIM cards is terminated, the application program retrieves the results of the programming and transmits a message to the PLC 210 to unload the eight SIM cards from the conveyor belt 115. Afterwards, other SIM cards are loaded on the conveyor belt 115 to be programmed.

FIG. 3 is a block diagram representing the personalization procedure. The production machine loads SIM cards on the conveyer belt at stage 300, and the heads 110 are moved down to contact the SIM cards 105 and start programming at stage 310. Programming is ongoing at stage 320 and when it is finished, the application program retrieves results, at stage 330. At last, the SIM cards on the conveyer belt are unloaded, at stage 340.

The application program is thus used to determine whether the programming operation was successful or not for each SIM card. Depending on the results retrieved from the heads of the production machine, the application program transmits such results to the PLC 210 so that the correctly programmed SIM cards unloaded 150 from the conveyor belt may be separately delivered with respect to the incorrectly programmed or not programmed SIM cards. The incorrectly programmed SIM cards are reloaded 140 into the production machine 100. In fact, if the cause of failure is not critical but, for example, caused by a bad contact between the head 110 and the SIM card 105, the SIM card 105 can be reloaded on the conveyor belt to be programmed.

The personalization includes several commands. In particular, an "OpenShort" command, executed to check open-circuit and short-circuits, often fails due to an incorrect contact between the head 110 and the SIM card 105, even though the hardware of the SIM card 105 is not defective and it might be successfully programmed, if correctly positioned. Thus, an incorrect detection causes low yield and time costs for the personalization. Moreover, failures in programming are counted, for example, for measuring a quality of the production machine or plant which may be associated to a percentage of correctly personalized SIM cards. However, in the method described above, the number of failures is affected and increased by errors in contacting SIM cards in a first programming, even if such SIM cards are correctly personalized in a following programming, and thus not discarded. In other words, the failure count is not indicative of a number of SIM cards discarded.

SUMMARY

The technical problem at the base of the present disclosure is how to improve the throughput of SIM card programming and to reduce the time required to identify SIM cards that need to be discarded, for example, because of defective hardware, with respect to SIM cards for which the programming failed due to a temporary error in the personalization process. Also, the present disclosure has an object of allowing precise counting of the SIM cards to be considered defective due to an effective failure in the programming, thus providing an approach to the limitation that currently affects the typical SIM card personalization.

A method for personalizing a SIM card may include loading the SIM card on a conveyor belt of a production machine, programming the SIM card, unloading the programmed SIM card from the conveyor belt and checking an intermediate result of the programming. The method may include reprogramming the SIM card if the intermediate result is wrong, before the SIM card is unloaded from the conveyor belt.

Advantageously, if the intermediate result is wrong, the SIM card is not unloaded from the conveyor belt but a second attempt of programming, i.e. the step of reprogramming, is immediately executed. Advantageously, SIM cards, which fail in the programming step and are correctly programmed in the reprogramming step, may be programmed efficiently since these SIM cards are not unloaded and reloaded on the conveyor belt but are directly delivered towards an output of correctly programmed SIM cards. At the same time, the SIM cards for which also the reprogramming step fails, may be delivered to an output of defective SIM cards.

Additionally, more than one reprogramming, each one comprising the check of the intermediate result, may be executed before unloading the SIM card from the conveyor belt and delivering it to the output of defective cards. The programming may comprise a mechanical action including moving the head of the production machine to contact the SIM card and the reprogramming repeats the step of moving the head to adjust the contact between the head and the SIM card. In fact, an incorrect position between the head and the SIM card in the programming may often be solved simply by uncoupling the head from the SIM card, so that the SIM is no more contacted, and re-coupling them, i.e. moving again the head on the SIM cards, in the step of reprogramming.

The step of programming and reprogramming may include data transfer for programming the SIM card. The programming may move the head from a position in which the SIM card is not contacted to a contact position, and the reprogramming may move the head from the contact position, in which the failure of the programming has been detected with the wrong intermediate result, to the position in which the card is not contacted and again to the contact position, to repeat or retry the data transfer. The data transfer of the programming and reprogramming, for example, may include OS loading, common file loading, and/or IC card specific data loading.

The step of moving may comprise detaching and re-attaching the head from/to the SIM card. The detaching may include opening fastening means or a fastener of the head from the SIM card and the attaching includes reclosing the fastener on the SIM card. The programming may comprise sending a message from a PLC to a PC, which is a slave in communication with the PLC. The message may be used to notify the PC that the head is ready to start personalization. When the application program on the PC receives a message confirming a correct position of the cards on the conveyor belt, it may start the programming.

In some embodiments, the reprogramming also may comprise reissuing a command from the personal computer to the PLC. Advantageously, the reissued command may be managed from the PC. Through such a PC, the SIM cards for which retrying a programming may be distinguished from the SIM cards which may be discarded without (further) retrying a programming. In this respect, the intermediate result may provide an error code indicative of a type of failure in the programming or indicative of a specific failure, allowing the PC to select whether to reprogram or not. The error codes and the type of failures for which (further) re-trying or not re-trying a programming of a SIM card may be configurable in the PC. The loading may be executed on a plurality of SIM cards on the conveyor belt, preferably with a plurality of corresponding heads of the production machine.

In this respect, programming, retrieving the result, unloading the programmed SIM card, checking an intermediate result of the programming, terminating and reprogramming may be executed contemporaneously on the plurality of SIM cards. The command to be checked may be configurable and preferably set before starting the programming. Such configuration of the command to be checked may be preferably saved in a configuration file setting. The intermediate results of the programming of each SIM card may be saved so that the PC may request reprogramming from zero to all the SIM cards not correctly programmed or not programmed on the conveyor belt, on the case of the saved intermediate results.

Another aspect is directed to a production machine for executing the method according the present disclosure. Further advantages and features of the method and production machine according to the present invention will be apparent from the description given here below only for exemplary purpose and without limiting the scope of protection of the present invention.

BRIEF DESCRIPTION OF THE DRAWINGS

FIG. 6A to 6E are schematic diagrams of an exemplary process for adjusting the position of heads and cards, according to the present disclosure.

DETAILED DESCRIPTION OF THE EMBODIMENTS

Figure 1:
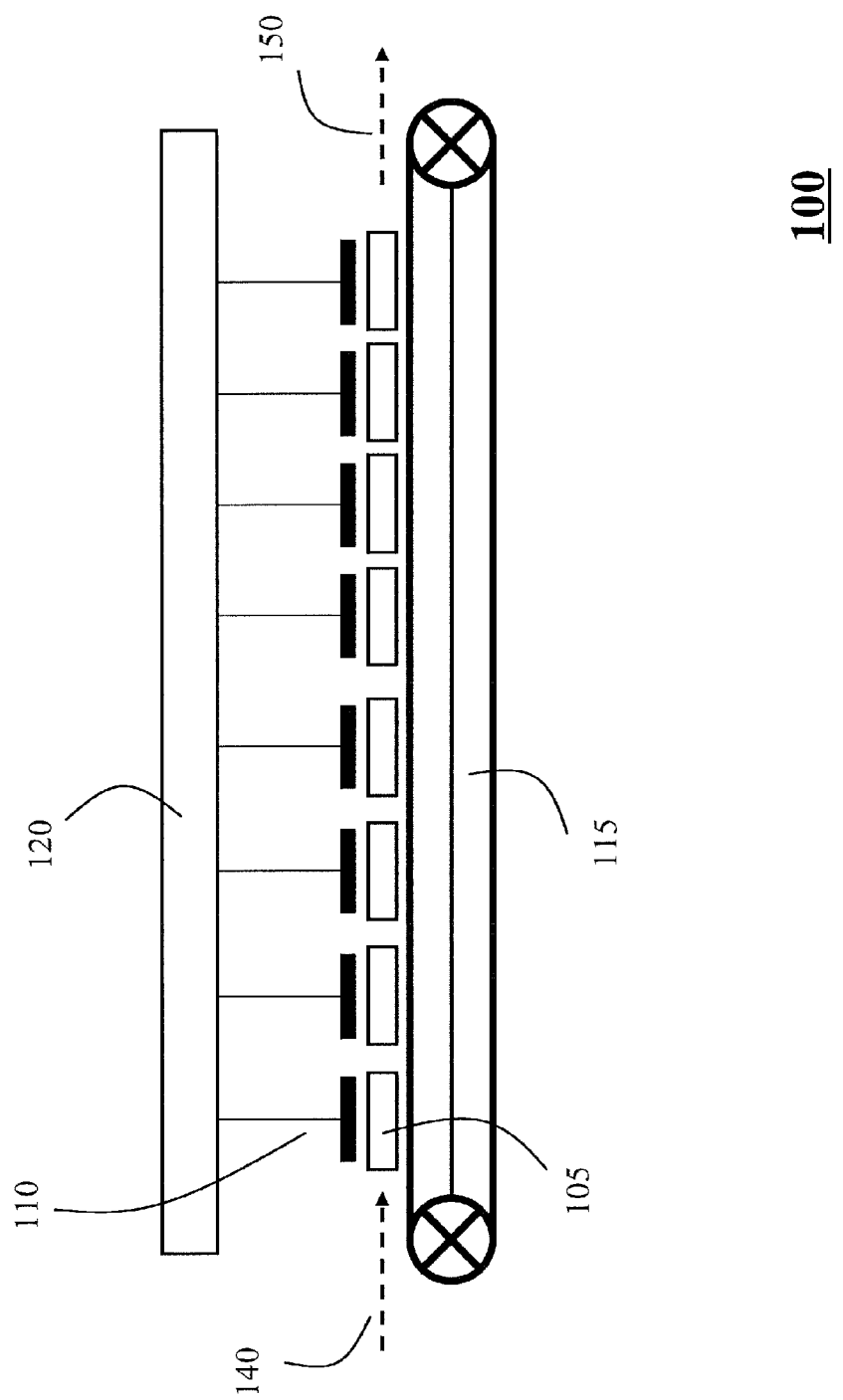
FIG. 1 is a schematic diagram of a production machine for personalizing a SIM card, according to the prior art.
Figure 2:
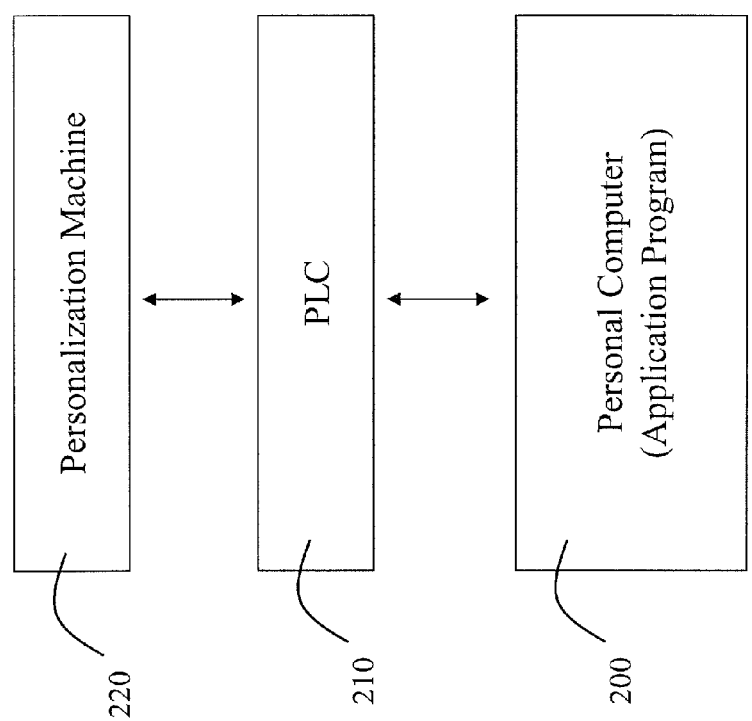
FIG. 2 is a schematic diagram of the system configuration of the production machine of FIG. 1.
Figure 3:
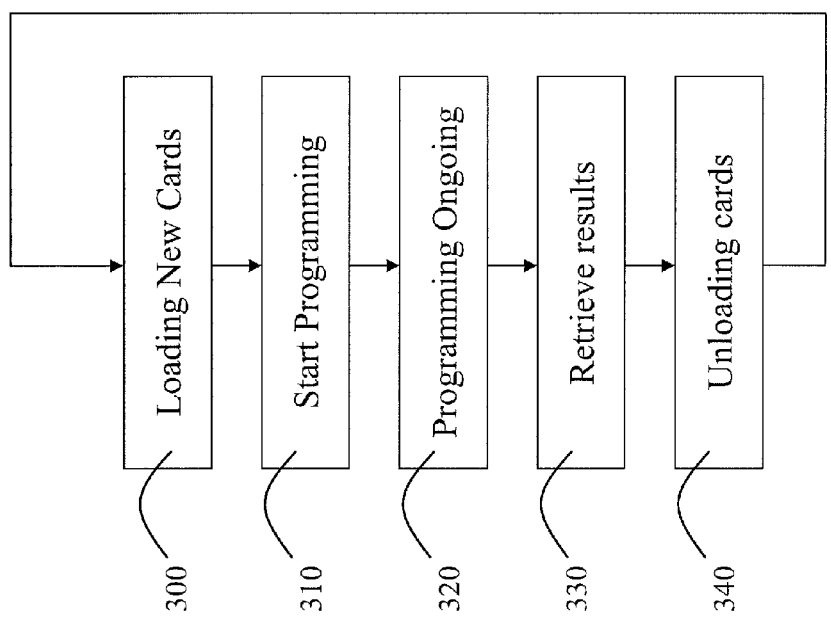
FIG. 3 is a flowchart of the personalization procedure of the production machine of FIG. 1.
Figure 4A:
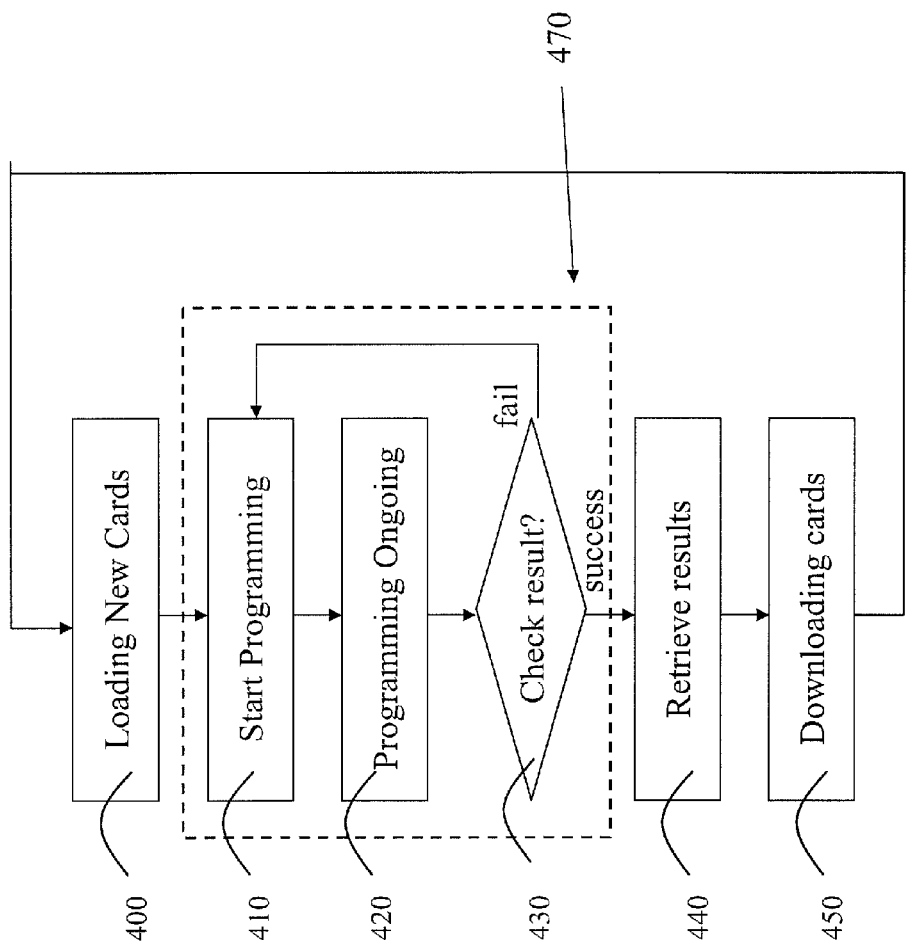
FIG. 4A is a flowchart of a personalization method, according to the present disclosure.
Figure 5:
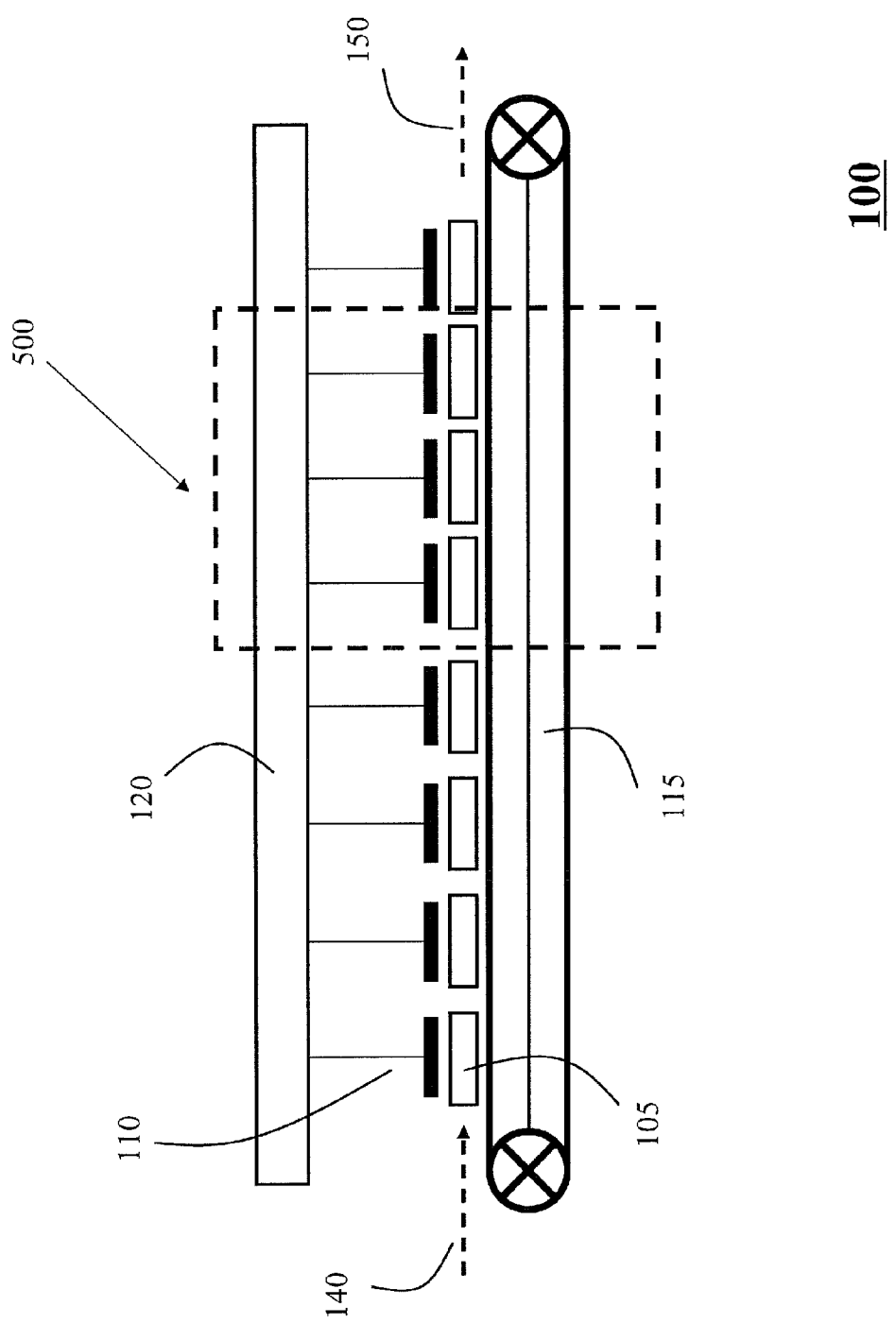
FIG. 5 is a schematic diagram of a production machine performing the personalization method of FIG. 4C.

The method for personalization SIM cards according to the present embodiments is shown with reference to the diagram block of FIG. 4A and to FIG. 5, wherein a plurality of SIM cards 105 to be programmed are loaded on a conveyer belt 115 of a production machine 100 at step 400. The term conveyor belt is given hereafter to exemplify the personalization process of the SIM card in an industrial plant, but clearly different means may be used to move the SIM card to be programmed under a head of the production machine or to move the head of the production machine instead of moving the SIM cards. A SIM card loaded on the conveyor belt is programmed starting from step 410, where the head of the production machine 100, which is controlled from a PLC 210, is moved to contact the SIM card 410.

A PC 200 slave receives from the PLC (master) a message specifying a position of the SIM card on the conveyor belt. When the application program on the PC receives a message confirming a correct position of the SIM card on the conveyor belt, it starts programming the card.

More particularly, a plurality of commands may be transmitted from the application software 200 to the head of the production machine, for executing specific operations on the SIM cards. These commands include an "OpenShort" command, provided for checking open-circuits and short-circuits, which may fail simply for an incorrect contact or positioning between the head 110 and the SIM card 105, even though the hardware of the SIM card 105 is not defective. More than one head 110 may move contemporaneously or sequentially with a predetermined time difference to contact the respective plurality of SIM cards and program contemporaneously or sequentially the SIM cards, as shown at step 420.

According to the present embodiments, at step 430, a result of the operation associated to a command for programming the SIM cards is checked, in order to detect whether the programming is ongoing correctly or a failure has occurred. Advantageously, the check is executed before unloading the SIM card from the conveyor belt, and preferably more than one time during the programming of the SIM card, to repeat the programming when a failure is detected in the command. In this respect, before starting the programming of SIM cards, a configuration of the command(s) to be checked is set up and saved. It has been observed that some errors are due to a wrong positioning of the head of the production machine with respect to the SIM card, which may be solved simply by re-executing the mechanical coupling between the head and the SIM card, thus obtaining a correct programming of the SIM card.

According to the present disclosure, if a command is terminated with an error or an unexpected value, the failure is retrieved from the head(s) of the production machine through the application software, and the application software starts the programming again from step 410. On the contrary, if the commands are successful, for instance, if they are terminated with an expected value or state, the results retrieved from the head(s) of the production machine, at step 440, are transmitted to the PLC 210, which unloads cards from the conveyer belt. Step 470 defines an intermediate check loop and includes steps 410, 420, and 430. At step 450, the SIM cards are downloaded.

In an aspect, a plurality of processes or threads are executed for programming more than one SIM card at the same time. For example, in an embodiment, a predetermined number of threads X corresponding to a predetermined number X of SIM cards loaded on the conveyor belt is executed.

For example, 8 threads are created for programming 8 SIM cards on the conveyor belt 115, and each thread performs the steps 410, 420 and 430 independently. Since there is more than one thread performing the programming processes, each SIM card 105 is controlled separately, regardless of the execution of other threads. If an error message for an inputted command for one SIM card 105 is retrieved from the heads earlier than other results of commands for other SIM cards 105, the inputted command which returned the error message is executed on the SIM card 105, without intervening on execution of other threads involved in the programming or reprogramming other SIM cards 105.

Figure 4B:
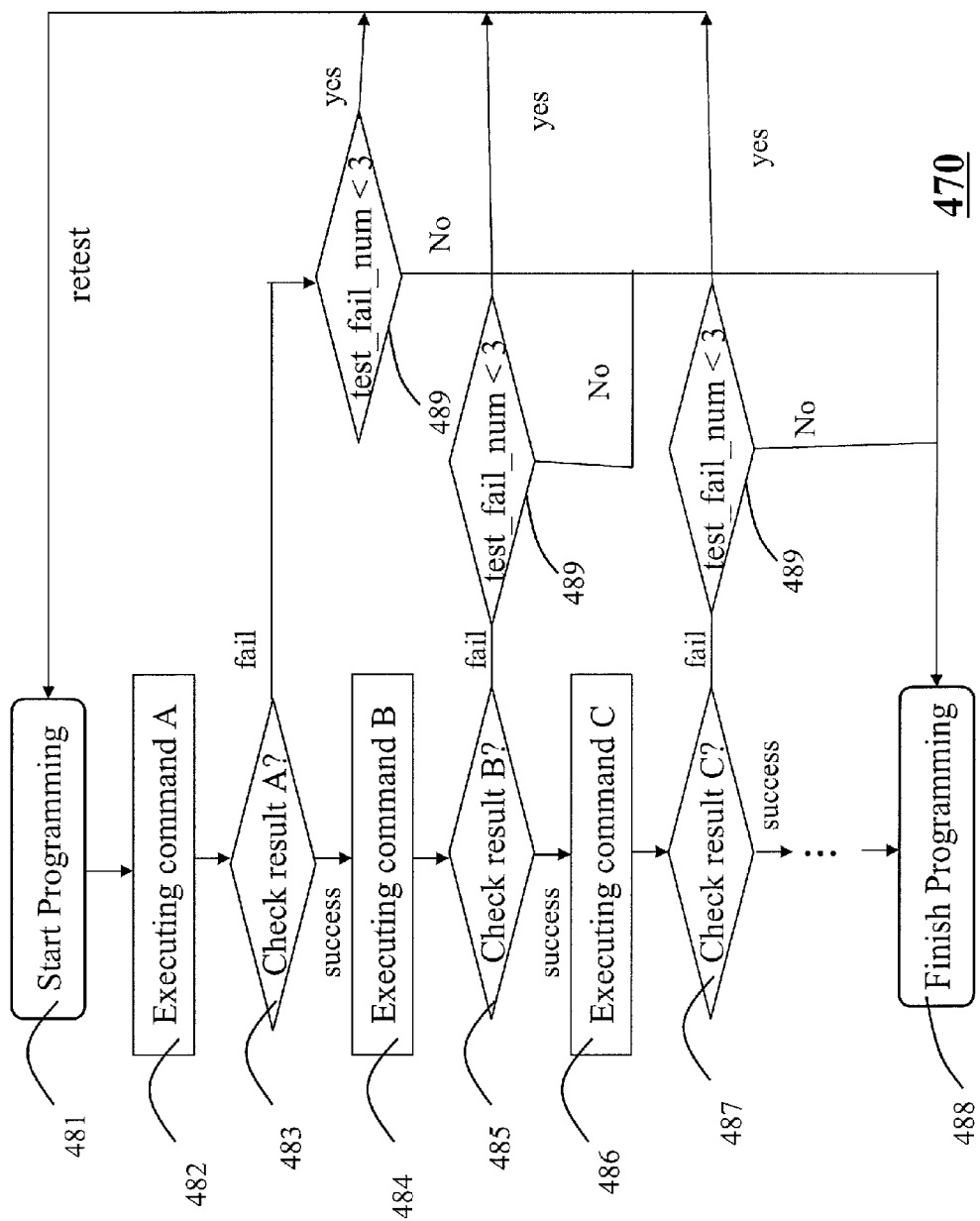
FIG. 4B is a sub-flowchart of the steps 410, 420, and 430 of FIG. 4A.

FIG. 4B represents a sub-diagram of FIG. 4A, which is executed by each thread for the corresponding SIM cards. The programming for a SIM card is started at 481 for a corresponding thread and a command A, for example, an "Open-Short" command, which is executed at step 482. The result for the command A is retrieved from the heads, through the application program, and is checked at step 483 in the application program. A next command 'B' is executed (step 484) if the command A is terminated correctly. Otherwise, a counter of failure is incremented in the application program, at step 489, and compared to a threshold value. Result B is checked, and then command C is executed. Result C is then checked. (steps 485-487) The programming is finished at step 488 if the threshold value is exceeded by the failure count, otherwise the whole programming thread affected by the error is restarted. This may be necessary because the detach and the following re-attach of the heads with the SIM card causes the power off of the card itself and the need of starting the electrical process from the beginning.

Advantageously, when an operation requested by a command fails, it is repeated without proceeding to the following commands and without completing the programming. This embodiment may be expedient because it reduces the time involved for repeating the commands; in fact, if one command fails several times, after corresponding re-executions, the following commands are never executed and the SIM card is quickly discarded as defective.

In other words, if the re-execution of any command configured to be checked fails more than k times (for example k=3), the SIM card is discarded. If the command failed is different from any one of the commands selected to be checked, the SIM card may be discarded without any attempts to reprogramming it again. Critical commands to be checked are set in a configuration step before starting programming.

Advantageously, if an error occurs for one card at an early phase of the programming, the total amount of time spent for the retrying the programming is reduced. For example, eight cards are on the conveyor belt 115, and 10 seconds are required to perform one entire cycle of programming, i.e. for executing commands A, B, C, without any checks. For example, command A is "OpenShort" command, and 1 second is required to execute it. Thus, if command A fails because of contact problem between the SIM card 105 and the head 110 and it is executed immediately after the failure, the programming takes 11 seconds (10+1) total (in this example, it is supposed that A succeeds after re-execution).

On the contrary, if the command is re-executed at the end of the whole programming, i.e. after executions of commands A, B, C, and the failure of command 'A' for one card is detected only at that point, the whole programming should be resumed from the beginning. In this case, the time spent for reprogramming is 20 seconds (10+10), thus reducing the throughput of the personalization process.

In another aspect, the check of results is implemented with a controlling thread, and not inside each thread executing the operation required by a command, also indicated as controlled threads. Thus, each controlled thread executes its corresponding commands serially, and the controlling thread or process monitor the results of each command of each thread and request a re-execution of the controlled thread, whether a failure is detected. Preferably, the controlling thread introduces a waiting time, for example, a few milliseconds, between commands. If a failure is detected in some controlled threads, the controlling thread requests a re-execution of the failed threads. According to this aspect, the software application may be simplified, since the controlled threads proceeds in the execution of same commands.

Figure 4C:
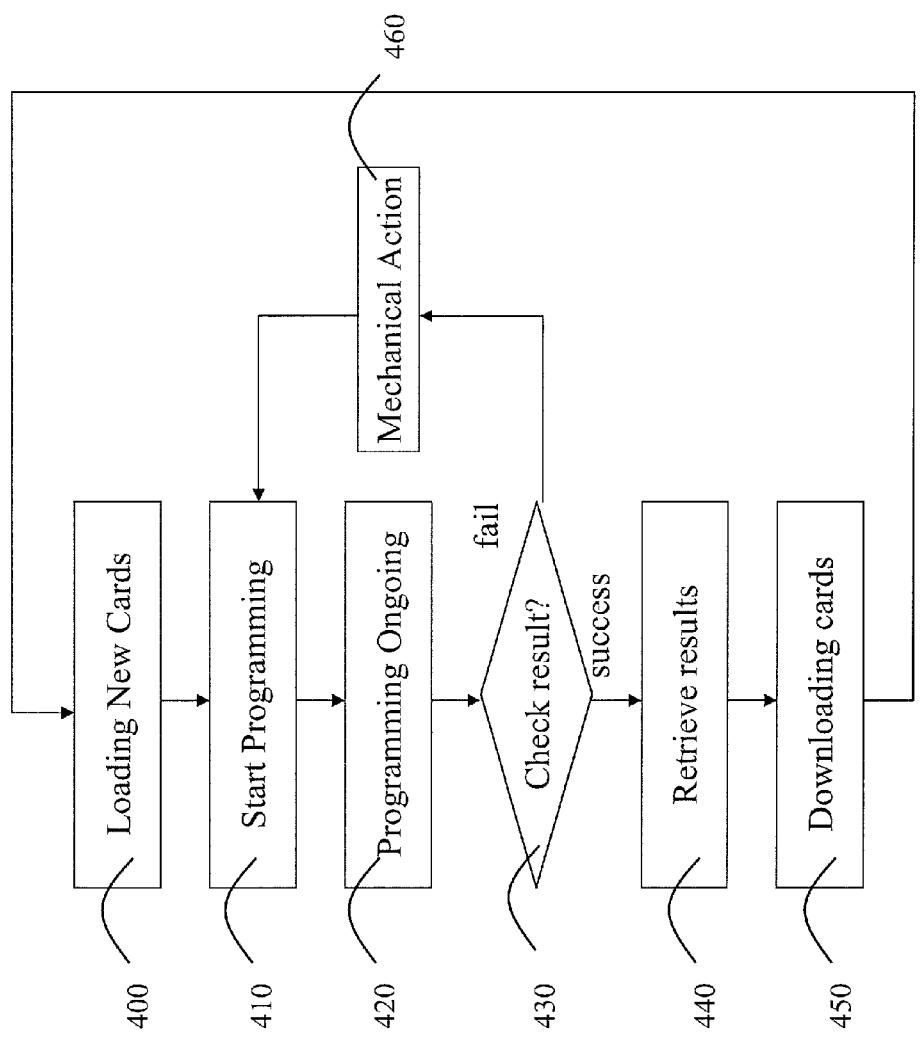
FIG. 4C is a flowchart of another embodiment of the personalization method, according to present disclosure.

FIG. 4C shows a block diagram representing the personalization procedure according to another aspect. The personalization process begins at step 400, i.e. loading at least one SIM card on the conveyor belt 115. The programming of the SIM card starts at step 410 when the application program on the PC receives from the PLC a message confirming a correct position of the cards on the conveyor belt.

The heads 110 of the production machine are moved to contact the SIM cards 105 contemporaneously and the programming is ongoing at step 420. Each command is checked at step 430: if a command fails, it is re-executed as described at step 410, otherwise its results are retrieved from the head(s) at step 440. The SIM cards are than downloaded from the conveyer belt 115. In this embodiment, if the check result is wrong, a mechanical action 460 is performed on the SIM card before the command is re-executed. For example, the mechanical action may adjust the contact position between the head 110 and the SIM card 105. If the 'OpenShort' command is failed, the mechanical action is quite effective to correct the error.

FIG. 5 shows a production machine performing the personalization processes. The production machine 100 comprises a conveyer belt 115, a number of heads 110, and a support for the heads 120. The SIM card 105 is loaded on the entry of the conveyer belt 115, and the production machine 100 is controlled by a PLC 210. The process performed after a re-execution of a failed command described with reference to the dashed portion 500 and FIGS. 6A to 6E, showing partial diagrams 510, 520 of a process for adjusting the position of the head and the SIM card after the command is issued.

Figure 6B:
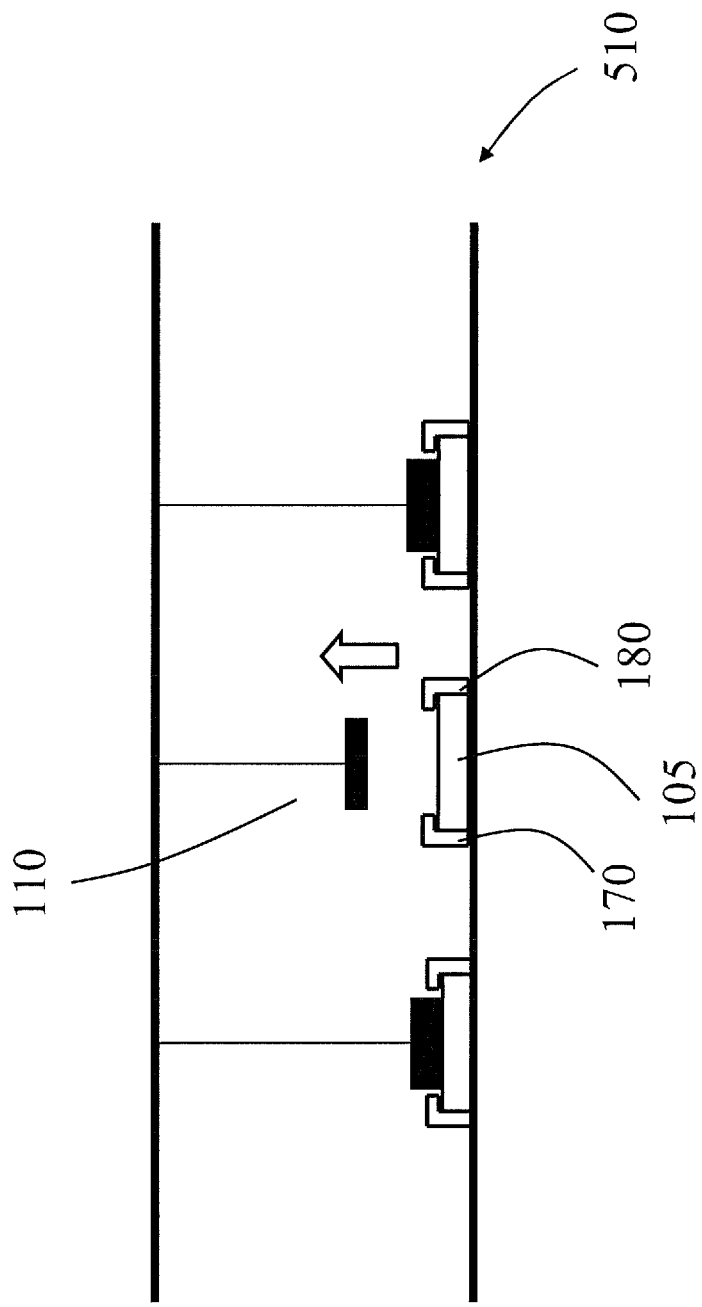
Figure 6D:
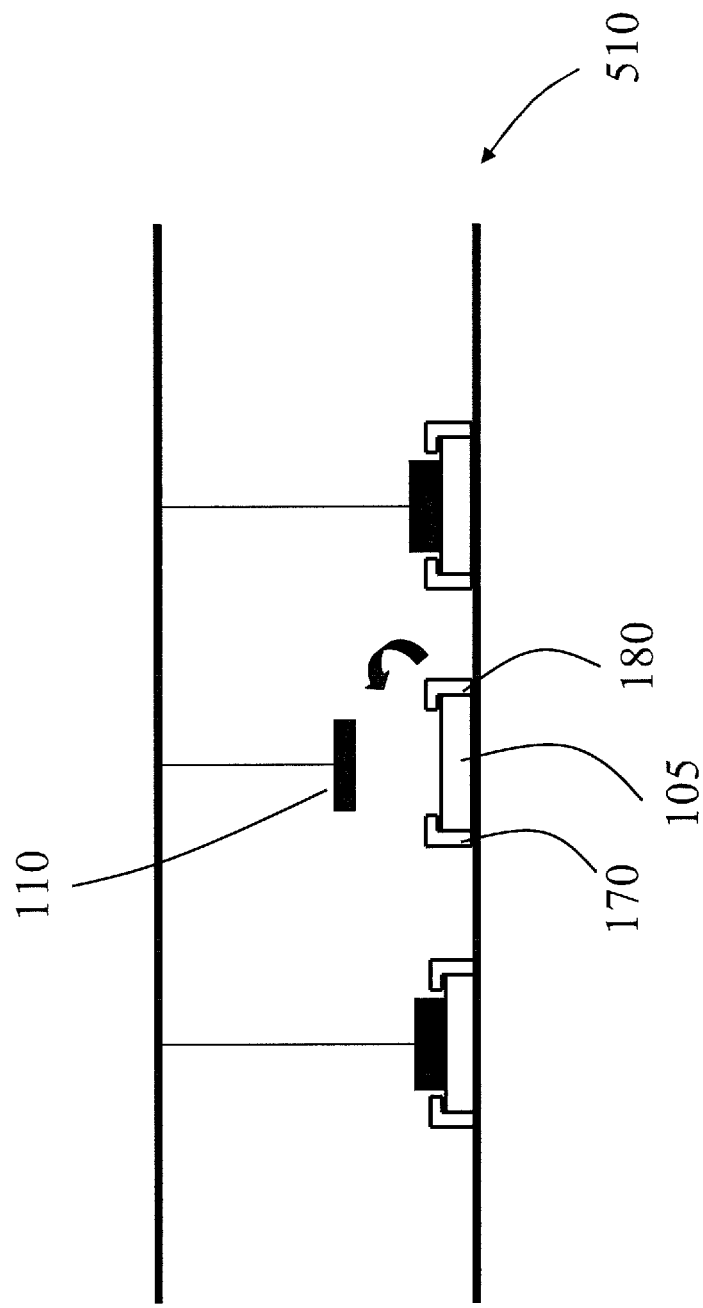
Figure 6E:
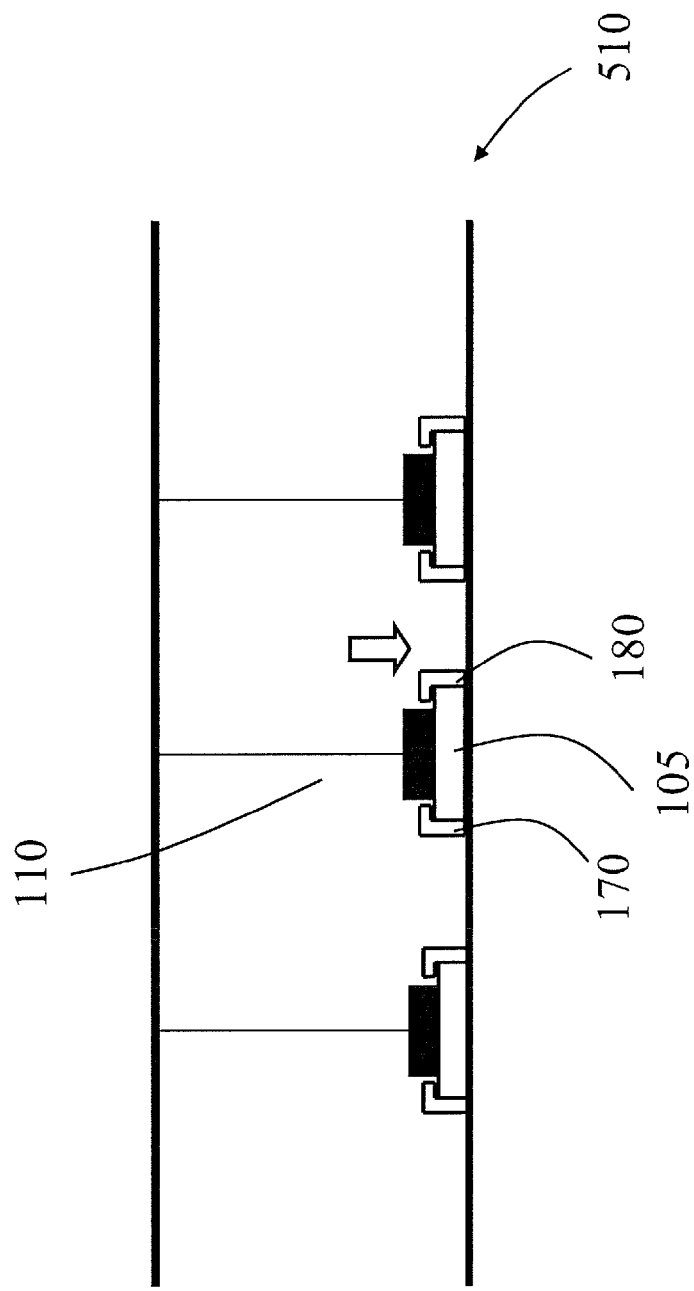

The PLC 200 receives a command from the application software 200 and executes a mechanical action for adjusting the position of contact point of the head 110. For example, the PLC 200 receives a command to be re-executed and detaches the head 110 from the SIM card 105, as depicted in FIG. 6B. A left blocking jaw 170 and a right blocking jaw 180 are opened as depicted in FIG. 6C. In FIG. 6D, the left blocking jaw 170 and the right blocking jaw 180 are reclosed so that the head 110 contacts again the SIM card 105 as depicted in FIG. 6E, and the programming procedure for personalization may be resumed, i.e. re-programmed. Of course, the command to be re-executed may be associated to a different operation, not involving a mechanical action or involving a different mechanical action with respect to the one described above.

In this example, the mechanical action for adjustment is simply opening and reclosing the blocking jaws. It has found that a short movement of the SIM card 105, simply due to an adaptation of the card on the conveyor belt after that the head of the production machine has contacted the SIM card for the first time and released it, may often results in a better contact with the head 110, allowing a correct programming. In many cases, this simple action can be enough, and the personalization failure caused by the OpenShort command is remedied.

More sophisticated operation for adjustment may be implemented. For example, a head comprising a sensor to detect the position mismatch with the SIM card 105 may be used, in order to correct the position based on the data detected from the sensor. Thus, after opening the blocking jaws 170 and 180, the position is adjusted based on data detected from the sensor in the previous and incorrect positioning.

Texts prove that 99% of the failed commands, especially the OpenShort commands was successful after re-execution and the throughput of the procedure was drastically improved. Advantageously, the OpenShort reject cards can be reworked in a separate process, reducing the wasted time and improving the throughput.

Checking an intermediate result of programming the SIM card and reprogramming the SIM card before unloading it from the conveyor belt, if the intermediate result is wrong, may reduce the time spent to retry a personalization of the SIM card, when a previous programming does not terminate correctly, and also may reduce the time for identifying a defective SIM card, since the SIM card is not removed from the conveyor belt and the intermediate result may be checked one or more time before completing all the operations of programming. Moving the head of the production machine to contact the SIM card and repeating such movement in the reprogramming step, is often sufficient to adjust the contact, since the reconnection of the head after disconnection occurs with a better alignment, and an improved mechanical coupling may provide the safe electrical connections among the SIM card and the head. In fact, the reprogramming comprises a mechanical action for adapting the SIM card on the conveyor belt after the head of the production machine has contacted the SIM card for a first time in the step of programming, and the mechanical action changes the position of the SIM card with respect to the head for improving the contact in the reprogramming step.

Detaching the head from the SIM card includes opening fastening means or fastener of the head from the SIM card, i.e. leaving the SIM card on the conveyor belt after a step of programming, and re-attaching includes reclosing the fastener on the SIM card, i.e. taking the SIM card from the conveyor belt with an improved coupling. Advantageously, a first attaching followed by a detaching of the head, works like an alignment device to improve the alignment of the head and the SIM card.

Advantageously, the method for personalizing is executed on a plurality of SIM cards, loading them on the conveyor belt (115), and personalizing with more heads, which may, for example, work as an alignment device for corresponding SIM cards or as testing means or a tester, since the mechanical coupling and the electronic data transfer may be repeated in each head. Executing threads for programming the plurality of SIM cards on the conveyer belt independently is advantageous because it allows a separate managements of the steps of programming, unloading, checking an intermediate result and reprogramming or any repetitions of these steps for retrying a previously failed personalization. Advantageously, counting the failures of programming and reprogramming only if the counted failures do not exceed the threshold value, helps the user decide when a further reprogramming is not helpful, since the SIM card has defective hardware.

Implementing the check of the intermediate results with a controlling thread which requests a re-execution of one or more of threads, and determining whether the intermediate result of the corresponding thread is wrong may allow centralized control of the repetitions of programming. The threads are only charged for the separate programming and personalization of SIM cards.

Advantageously, different steps of programming, retrieving the result, unloading the programmed SIM card, checking an intermediate result of the programming, terminating and reprogramming are executed contemporaneously on the plurality of SIM cards. Different steps correspond to different states of execution of the threads. Selecting SIM cards for which the intermediate result is wrong after the execution of the programming step and/or the reprogramming step may allow to separate correctly personalized SIM cards from incorrectly personalized or non-personalized SIM cards. The selection is made to load the SIM cards onto the conveyor belt only one time.

That which is claimed is:

1. A method for personalizing a subscriber identity module (SIM) card comprising:
    loading the SIM card on a conveyor of a production machine;
    programming the SIM card with the production machine by moving at least one head of the production machine to contact the SIM card;
    checking whether an intermediate result of the programming is either wrong or correct;
    when the intermediate result is wrong, then
        repositioning the SIM card on the conveyor after the production machine has contacted the SIM card for a first time in the programming of the SIM card, the repositioning comprising moving the at least one head to disconnect and reconnect to the SIM card for adjusting a contact therebetween,
        reprogramming the SIM card before unloading from the conveyor and after the repositioning, and
        repeating the checking of the intermediate result; and
    when the intermediate result is correct after at least one of the programming and the reprogramming, unloading the programmed SIM card from the conveyor.

2. The method according to claim 1 wherein the repositioning changes a position of the SIM card with respect to the at least one head for improving the contact in the reprogramming.

3. The method according to claim 1 wherein the repositioning comprises:
    detaching the production machine from the SIM card;
    leaving the SIM card on the conveyor after the programming; and
    reattaching the production machine to the SIM card from the conveyor, the detaching including opening a fastener of the production machine from the SIM card and the reattaching including reclosing the fastener on the SIM card.

4. The method according to claim 1 wherein the programming comprises sending a message from a programmable logic controller (PLC) to a computer, the message indicating that the PLC has correctly positioned the SIM card under the at least one head of the production machine and the computer can start the programming of the SIM card.

5. The method according to claim 1 wherein the loading comprises loading a plurality of SIM cards on the conveyor; and wherein the production machine comprises a plurality of heads.

6. The method according to claim 5 wherein a plurality of threads are executed for programming the corresponding plurality of SIM cards on the conveyer, each thread performing independently the programming, unloading, checking, and reprogramming.

7. The method according to claim 6 further comprising maintaining a failure count for each SIM card and comparing the failure count to a threshold value; and wherein the reprogramming for each SIM card is executed only if the failure count for each SIM card does not exceed the threshold value.

8. The method according to claim 7 wherein the checking of the intermediate result is based upon a controlling thread requesting a re-execution of at least one of the plurality of threads.

9. The method according to claim 8 wherein the programming, the unloading of the programmed SIM card, the checking of the intermediate result, and the reprogramming are executed contemporaneously on the plurality of SIM cards.

10. A method for personalizing a subscriber identity module (SIM) card comprising:
loading the SIM card on a conveyor of a production machine;
programming the SIM card by moving at least one head of the production machine to contact the SIM card, and sending a message from a programmable logic controller (PLC) to a computer, the message indicating that the PLC has correctly positioned the SIM card under the at least one head and the computer can start the programming of the SIM card;
checking whether an intermediate result of the programming is either wrong or correct; and
when the intermediate result is wrong, then
repositioning the SIM card on the conveyor after the at least one head of the production machine has contacted the SIM card for a first time in the programming of the SIM card, the repositioning changing a position of the SIM card with respect to the at least one head, reprogramming the SIM card before unloading from the conveyor and after the repositioning, the repositioning comprising moving the at least one head to disconnect and reconnect to the SIM card for adjusting a contact therebetween, and
repeating the checking of the intermediate result; and
when the intermediate result is correct after at least one of the programming and the reprogramming, unloading the programmed SIM card from the conveyor.

11. The method according to claim 10 wherein the repositioning comprises:
detaching the at least one head from the SIM card;
leaving the SIM card on the conveyor after the programming; and
reattaching the at least one head to the SIM card from the conveyor, the detaching including opening a fastener of the at least one head from the SIM card and the reattaching including reclosing the fastener on the SIM card.

12. The method according to claim 10 wherein the loading comprises loading a plurality of SIM cards on the conveyor; and wherein the production machine comprises a plurality of heads.

13. The method according to claim 12 wherein a plurality of threads are executed for programming the corresponding plurality of SIM cards on the conveyer, each thread performing independently the programming, unloading, checking, and reprogramming.

14. The method according to claim 13 further comprising maintaining a failure count for each SIM card and comparing the failure count to a threshold value; and wherein the reprogramming for each SIM card is executed only if the failure count for each SIM card does not exceed the threshold value.

15. The method according to claim 13 wherein the checking of the intermediate result is based upon a controlling thread requesting a re-execution of at least one of the plurality of threads.

16. A device for personalizing a subscriber identity module (SIM) card comprising:
a conveyor configured to advance the SIM card;
at least one head adjacent said conveyor; and
a controller cooperating with said at least one head and configured to
program the SIM card by moving said at least one head to contact the SIM card,
check whether an intermediate result of the programming is either wrong or correct, and
when the intermediate result is wrong, then
reposition the SIM card on said conveyor after said at least one head has contacted the SIM card for a first time in the programming of the SIM card, the repositioning comprising moving said at least one head to disconnect and reconnect to the SIM card for adjusting a contact therebetween,
reprogram the SIM card before unloading from said conveyor and after the repositioning, and
repeat the checking of the intermediate result, and
when the intermediate result is correct after at least one of the programming and the reprogramming, unload the programmed SIM card from said conveyor.

17. The device according to claim 16 wherein the repositioning changes a position of the SIM card with respect to said at least one head for improving the contact in the reprogramming.

18. The device according to claim 16 wherein said controller and at least one head are configured to reposition by at least:
detaching said at least one head from the SIM card;
leaving the SIM card on said conveyor after the programming; and
reattaching said at least one head to the SIM card from said conveyor, the detaching including opening a fastener of said at least one head from the SIM card and the reattaching including reclosing the fastener on the SIM card.

19. The device according to claim 16 wherein said controller and at least one head are configured to program by at least sending a message from a programmable logic controller (PLC) to a computer, the message indicating that the PLC has correctly positioned the SIM card under said at least one head and the computer can start the programming of the SIM card.

20. The device according to claim 16 wherein said conveyor is configured to advance a plurality of SIM cards thereon; and wherein said at least one head comprises a plurality thereof.

21. The device according to claim 20 wherein a plurality of threads are executed for programming the corresponding plurality of SIM cards on said conveyer, each thread performing independently the programming, unloading, checking, and reprogramming.

22. The device according to claim 21 wherein said controller and at least one head are configured to maintain a failure count for each SIM card and compare the failure count to a threshold value; and wherein said controller and at least one head are configured to reprogram for each SIM card only if the failure count for each SIM card does not exceed the threshold value.

23. The device according to claim 22 wherein said controller and at least one head are configured to check the intermediate result based upon a controlling thread requesting a re-execution of at least one of the plurality of threads.

\* \* \* \* \*